United States Patent

Watanabe et al.

[11] Patent Number: 6,051,868
[45] Date of Patent: Apr. 18, 2000

[54] SEMICONDUCTOR DEVICE

[75] Inventors: Takeshi Watanabe; Akihiro Sawairi, both of Tokyo, Japan

[73] Assignee: NEC Corporation, Tokyo, Japan

[21] Appl. No.: 09/033,306

[22] Filed: Mar. 2, 1998

[51] Int. Cl.[7] .................................................. H01L 29/00
[52] U.S. Cl. ......................... 257/503; 257/500; 257/501; 257/510; 257/506; 257/508
[58] Field of Search ..................... 257/501, 503, 257/506, 508, 509, 510, 513, 629, 630, 500; 438/404, 422, 427, 405, 412, 430

[56] References Cited

U.S. PATENT DOCUMENTS

| | | | |
|---|---|---|---|
| 5,220,190 | 6/1993 | Taguchi et al. | 257/499 |
| 5,294,825 | 3/1994 | Nakagawa et al. | 257/487 |
| 5,386,135 | 1/1995 | Nakazato et al. | 257/369 |
| 5,449,946 | 9/1995 | Sakakibara et al. | 257/487 |
| 5,485,029 | 1/1996 | Crabbe et al. | 257/501 |
| 5,536,961 | 7/1996 | Nakagawa et al. | 257/374 |
| 5,644,157 | 7/1997 | Iida | 257/521 |

FOREIGN PATENT DOCUMENTS

| | | |
|---|---|---|
| 55-159552 | 5/1954 | Japan . |
| 5-13561 | 1/1993 | Japan . |
| 8-162521 | 6/1996 | Japan . |

*Primary Examiner*—Steven H. Loke
*Assistant Examiner*—Shouxiang Hu
*Attorney, Agent, or Firm*—Young & Thompson

[57] ABSTRACT

A semiconductor device composed of analog circuits operated by multiple power supplies is provided with a structure which enables to reduce cross talk sufficiently. In the present semiconductor device, first and second transistors formed on the p-type silicon substrate are surrounded by third and fourth high concentration n-type buried layers extending beyond two trenches provided so as to separately surround the first and second transistors. An n-type layer is formed on these high concentration n-type layers, and first and second electrodes are formed on the n-type layer. Electric potentials of the third and fourth high concentration n-type layers are stabilized at a fixed value by the supply of power through the electrodes mounted on the these layers in order to prevent cross talk.

13 Claims, 6 Drawing Sheets

SEMICONDUCTOR DEVICE

BACKGROUND OF THE INVENTION

1. Field of the Invention

The present invention relates to a semiconductor device, and more particularly relates to a semiconductor device comprising a high-speed analog circuits connecting to multiple-power supplies and specific structure capable of reducing cross talk originating in these analog circuits.

This application is based on Patent Application No. Hei 8-3052293 filed in Japan, the content of which is incorporated herein by reference.

2. Background Art

In general, it is essential to prevent cross talk in a semiconductor device comprising analog circuits. Cross-talk is a phenomenon in which the original signal to be processed is disturbed by random signals propagating through parasitic paths by parasitic resistance or by parasitic capacitance. Cross talk originates from paths through various parts of the device, such as, wiring, the epitaxial layers, the buried layers, and the substrate.

In order to reduce cross talk through wiring, a conventional method was elaborated in which a power supply was divided into multiple power supplies which are independent of each other. An example for preventing cross talk through the substrate is disclosed in Japanese Patent Application, First Publication, No. 63-181346. This conventional example, as illustrated in FIG. 6, reduces cross talk by stabilizing a potential of a conductive layer 721 at an earth potential of the semiconductor device by connecting the conductive layer 721 with a conductive earth-contact layer 724 formed under the buried layer 723 which is formed below regions consisting of a base region 722, an emitter region 717, and a collector region 716 which compose a transistor.

In analog circuits composed of bipolar transistors, the need to integrate elements to higher density has lead to the use not only of LOCOS (Local Oxidation of Silicon) film but also of a trench for separation of elements. An example of such separation of elements by trenches is shown in FIGS. 5A and 5B, in which two bipolar transistors 108 and 109 are separated by respective trenches 104 and 105. This conventional device is an example, in which the width of trench is made narrower in response to the need for integrating elements to higher density, and the first transistor 108 is used as a circuit for processing signals with large amplitude, such as the input and output buffers, while the second transistor 109 is used as a circuit for processing signals with small amplitude like a first stage amplifier.

In the above example, however, cross talk is generated between a first n-type buried layer 202 and a second n-type buried layer 203 due to parasitic capacitance between the first n-type buried layer 202 and a p-type semiconductor substrate 200 including trenches 104 and 105, and between the p-type semiconductor substrate 200 and the second n-type buried layer 203, and also due to the resistance of the p-type semiconductor substrate 200. This is because the parasitic resistance is decreased due to the narrowed space between two elements and the parasitic capacitance is increased due to element separation by the trench.

Cross talk through the substrate can be reduced by applying the conventional method disclosed in the above Japanese Patent Application to the above structure. That is, cross talk through the p-type semiconductor substrate 200 can be reduced, as shown in FIG. 7, by forming an earth-contact layer 724 under n-type buried layer 202 and 203, and by stabilizing the potential of the earth contact layer 725 at the earth potential of the semiconductor device.

However, it was found that the above conventional structure have problems in terms of reduction or elimination of cross talk.

The first problem is that such conventional structures are not effective for reducing cross talk in a particular semiconductor device, in which a power supply is separated into multiple power supplies for respective circuit blocks. The reason is that, the earth contact layer 724 is common for the whole substrate area so that a fluctuation of an potential or a voltage of, for example, an output circuit has affects on the functional operation of the other circuit on the same chip through the earth-contact layer 724. This effect appears markedly, for example, in the amplifier circuit which processes small signals.

The second problem is that the above conventional structure for reducing cross talk is not suitable for high speed operation of transistors. The reason is that, in the case of a npn-type transistor, since the first and second buried layers 202 and 203 are doped in high concentration, the parasitic capacitance between these buried layers 202 and 203 and the p-type high concentration earth-contact layer 724 increases, and, furthermore, since the conductive layers 721 formed on side walls of respective trenches are connected to the earth-contact layer 724, and since each transistor faces the conductive layer 721 across a thin insulating layer, the capacitance of the transistor against the substrate becomes extremely high.

SUMMARY OF THE INVENTION

In view of the above problems, a primary object of the present invention is the provision of a semiconductor device comprising high-speed analog circuits operated by respective power supplies which are independent of each other and a structure which enables sufficient reduction of cross talk.

In one aspect, the present invention provides a semiconductor device comprising: first and second element forming regions formed on a first conduction-type semiconductor substrate; a semiconductor region of a second conduction-type, for conducting current in the direction opposite to that of the first conduction type, formed so as to commonly surround the first and second element forming regions; and electrodes formed on the semiconductor region; wherein the electric potential of the semiconductor region is stabilized by the supply of power through the electrode.

In another aspect, the present invention provides a semiconductor device comprising: first and second element-forming regions; first and second semiconductor regions formed so as to separately surround the first and second element-forming regions, respectively; and first and second electrodes formed on each first and second semiconductor regions; wherein potentials of the first and second semiconductor regions are stabilized by the supply of power through the respective electrodes.

In yet another aspect, the present invention provides a semiconductor device in which both first and second electrodes are connected to respective individual power supplies, which are independent of each other.

In yet a further aspect, the present invention provides a semiconductor device characterized in that the substrate of the semiconductor device is a SOI (Semiconductor On Insulator) substrate.

In yet an other aspect, the semiconductor device of the present invention is characterized in that the semiconductor regions are formed as buried layers.

In yet an other aspect, the semiconductor device of the present invention is characterized in that the first and second element forming regions are surrounded by respective first trenches, and that the first and second element forming regions are surrounded by respective buried layers beyond the first trenches.

In yet an other aspect, the semiconductor device of the present invention is characterized in that each first trench is surrounded by the independent buried layer, which is surrounded by the respective second trench.

In still another aspect, the semiconductor device of the present invention is further characterized in that said first and second element forming regions are surrounded by LOCOS films respectively, and said LOCOS films are surrounded by the buried layer, respectively.

In the semiconductor device of the present invention, since the electric potential of the semiconductor regions surrounding the first and second element forming region is stabilized by the supply of power through the electrode on the surface of the semiconductor region, cross talk generated by paths through the epitaxial layer and through the buried layer located between elements can be eliminated. Cross talk caused through wiring can be eliminated by connecting the electrodes with respective independent power supplies. When the SOI substrate is adopted, the capacitance between the element and the substrate can be reduced, thereby, cross talk caused through the substrate can be eliminated.

BRIEF DESCRIPTION OF THE DRAWINGS

FIG. 1 illustrates a semiconductor device according to the first embodiment of the present invention.

FIG. 2 illustrates a semiconductor device according to the second embodiment of the present invention.

FIG. 3 illustrates a semiconductor device according to the third embodiment of the present invention.

FIG. 4 illustrates a semiconductor device according to the fourth embodiment of the present invention.

FIG. 5 illustrates an example of a conventional semiconductor device.

DESCRIPTION OF PREFERRED EMBODIMENTS OF THE INVENTION

A first embodiment of the present invention will be described referring to FIG. 1. FIG. 1 depicts a semiconductor device according to the first embodiment. This semiconductor device comprises two transistors which are separated by trenches and two transistor forming regions are surrounded by respective n-type semiconductor regions.

Figure 1A:
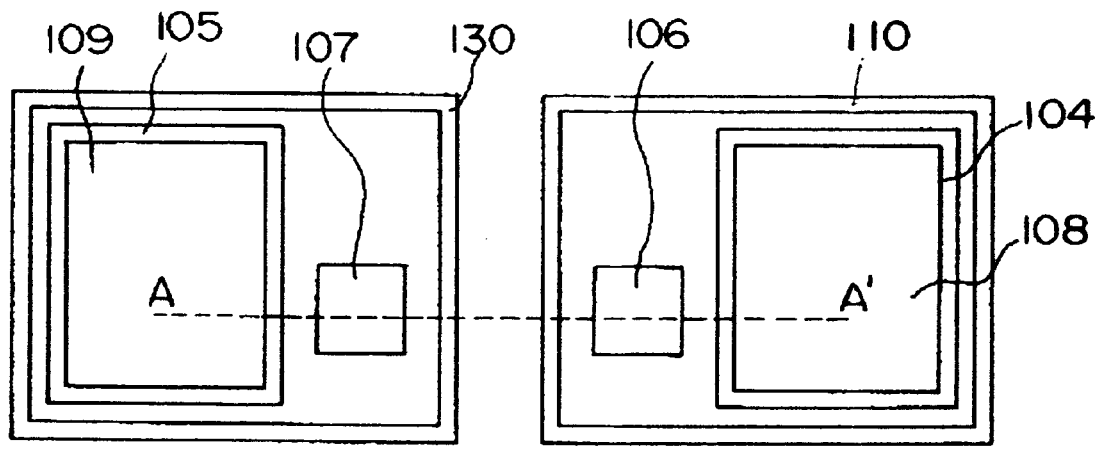
FIG. 1A is a plan view.
Figure 1B:
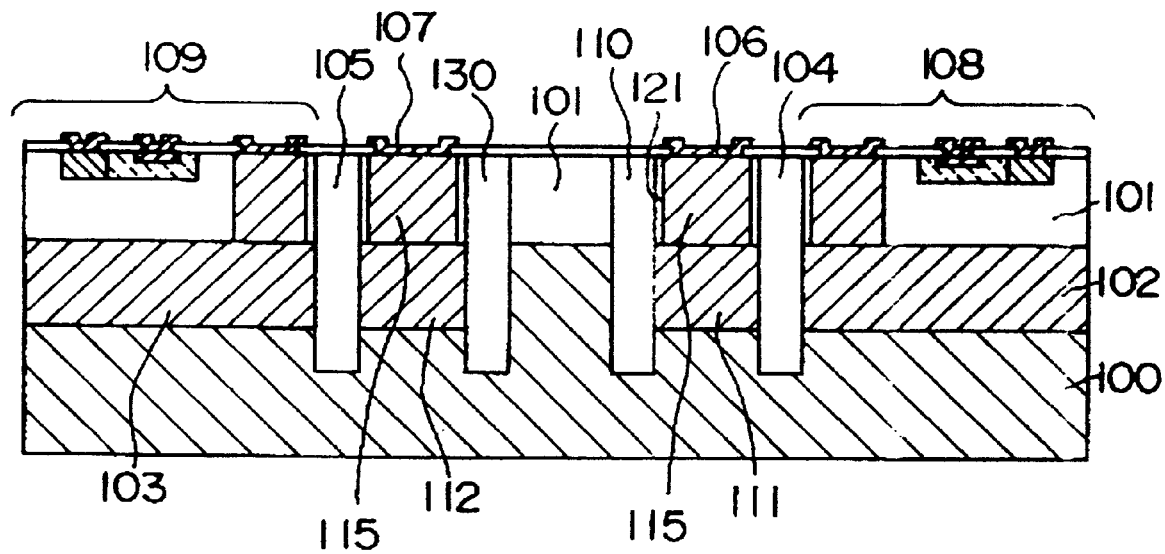
FIG. 1B is a cross sectional view along the line A-A'.

As illustrated in FIGS. 1A and 1B, a first high concentration n-type buried layer (a second-conduction-type semiconductor region 102) is formed in a region defined as a first element forming region, in which the first transistor is to be formed and which is located on a p-type silicon substrate (a first-conduction-type semiconductor substrate) 100, and a second high-concentration n-type buried layer (the second-conduction-type semiconductor region) 103 is formed in a region defined as the semiconductor element forming region, in which the second transistor is to be formed and which is also located on the p-type silicon substrate 100. The concentration of impurities of these high-concentration first and second buried layers 102 and 103 are $5 \times 10^{19}$ cm$^{-3}$ and these first and second buried layers are formed at the thickness of 2 μm.

On the first and second high-concentration n-type buried layer 102 and 103, epitaxilal layers 101 are respectively formed, which have an impurity concentration level of $10^{16}$ cm$^{-3}$, and which are formed at a thickness of 0.8 μm. Further, on each n-type epitaxial layer 101, the first and second transistors are formed, wherein the first transistor 108 constitutes a first circuit to be operated by a first power supply and the second transistor 109 constitutes the second circuit to be operated by a second power supply.

As shown in FIG. 1A, first trenches 104 and 105 are formed so as to surround the first and the second transistors 108 and 109, respectively. Inner walls of these trenches 104 and 105 are covered with an insulating film made of silicon oxide or silicon nitride, and the interiors of these trenches are filled with silicon oxide or polysilicon. These trenches have a width of 1 μm and a depth of 4.0 μm.

The second trenches 110 and 130 are formed outside of the first trenches 104 and 105, respectively. In a space between the first trenches 104 and 105 and the second trenches 110 and 130, a third high-concentration n-type buried layer or a second-conduction-type semiconductor layer 111 is formed so as to surround the high concentration n-type layer 102 formed under the first transistor 108. Similarly, the fourth high-concentration n-type buried layer or the second-conduction-type semiconductor region 112 is formed so as to surround the high-concentration buried layer 103 formed under the second transistor 109. These third and fourth high-concentration n-type buried layers 111 and 112 have the same impurity concentration and thickness as those of the first and second high-concentration n-type buried layers 102 and 103.

On the third and fourth high concentration n-type buried layers 111 and 112, similar high-concentration n-type layers 115 are formed, respectively, and on those layers 115, a first electrode 106 and a second electrode 107 are formed for supplying electric potentials to the third and fourth high-concentration n-type buried layers, respectively. These first and second electrodes 106 and 107 are connected to corresponding independent power supplies; thereby, the electric potentials of the third and fourth high concentration n-type buried layers can be stabilized at a fixed value by the supply of power.

Here, the fixed value is not limited to the maximum or minimum voltages for the circuits, and intermediate or optional voltages can be used for stabilization. It is most preferable to use the power supply connected to the corresponding circuit or a standard voltage generator for stabilizing the electric potential of the region surrounding the circuit block. However, the other power supply corresponding to the other circuits may be used, if the voltage fluctuation of the power supply is not so large.

According to the above semiconductor device, since the electric potentials of the n-type semiconductor regions corresponding to the third and fourth high-concentration n-type buried layers 111 and 112 surrounding respective transistors 108 and 109 are stabilized at a fixed value by power supply through the first and second electrodes 106 and 107 respectively, cross talk through the epitaxial layers and buried layers can be eliminated.

When the parasitic resistance is represented as r, the parasitic capacitance as c, and the circuit operating frequency of the high-concentration n-type semiconductor region as f, it is necessary to locate the electrode so as to satisfy the condition r c<½πf, in order to stabilize the electric potential of the high concentration n-type semiconductor region at a fixed value. This is because, if r c becomes large, the electric potential of a portion (apart from the electrode) of the high-concentration n-type semiconductor region cannot be stabilized at a fixed value, so that the electric potential fluctuation of the transistor region is transmitted to the other transistor through the high-concentration semiconductor layer, which results in the generation of cross talk.

For example, providing the first transistor 108 is used as the output transistor, the size of the transistor is 20×30 $\mu m^2$, the space between the first trench 104 and the second trench 110 is 10 $\mu m$, and the surface resistance of the third high concentration n-type buried layer is 15Ω/□, the parasitic resistance from the first electrode 106 to the third high concentration n-type buried layer 111 is estimated to be around 50Ω and the parasitic capacitance of the first trench 104 to be 0.04 pF. The frequency determined from the time constant of r c is calculated to be around 75 GHz. However, if it is desired to reduce cross talk to a level of 1/100, the operating frequency must be less than 15 GHz. In turn, in the case when the second transistor is used as an amplifier, the parasitic capacitance of the second transistor is identical to that of the second trench 130.

The second embodiment of the present invention will be described hereinafter referring to FIG. 2. FIG. 2 depicts the semiconductor device according to the present embodiment, which uses LOCOS film for element separation, in contrast to the first embodiment which make use of the trench for element separation.

Figure 2A:
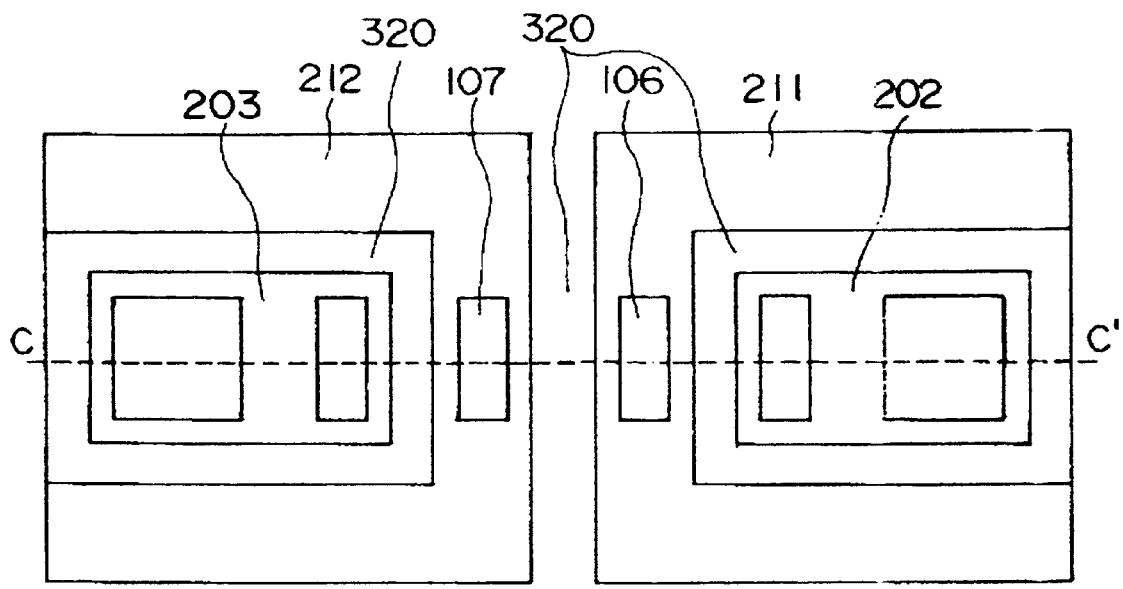
FIG. 2A is a plan view.
Figure 2B:
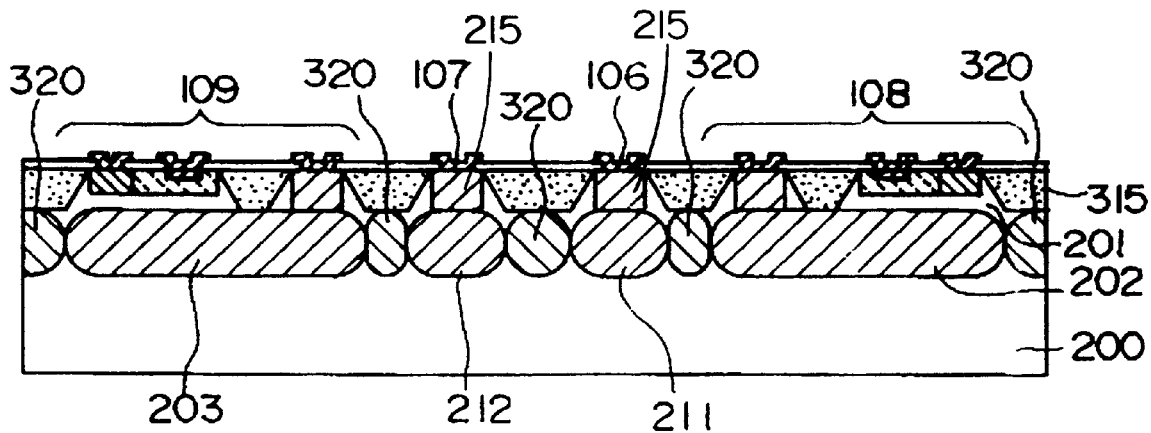
FIG. 2B is a cross sectional view along the line C-C'.

As shown in FIGS. 2A and 2B, a second n-type buried layer or a first-conduction-type semiconductor region 202 is formed in the region defined as the first element forming region in which a first transistor is to be formed and which is located on the p-type silicon substrate or the first-conduction-type semiconductor substrate 200, and a second n-type buried layer or a second-conduction-type semiconductor region 203 is formed in the region defined as the second element forming region in which the second transistor is to be formed and which is located on the same substrate 200. The concentration of impurities and the thickness of the first and second buried layers 202 and 203 are 5×10$^{19}$ cm$^{-3}$ and 2 $\mu m$, respectively.

On the first and second buried layers 202 and 203, n-type epitaxial layers 201 with an impurity concentration level of 10$^{16}$ cm$^{-3}$ are formed at a thickness of 0.8 $\mu m$. On the first and second buried layers 202 and 203, first and second transistors 108 and 109 are formed, wherein the first transistor 108 constitutes a circuit operated by the first power supply and the second transistor 109 constitutes a circuit operated by the second power supply.

On the surface of the n-type epitaxial layer 201 located between the first and the second transistors 108 and 109, a LOCOS oxide film 315 is formed at about a thickness of 1.0 $\mu m$. Under the LOCOS oxide film 315, a p-type buried layer 320 with a impurity concentration of 1×10$^{18}$ cm$^{-3}$ is formed at a thickness of 2 $\mu m$ as a channel-stopper. As a result, the first and second n-type buried layers 202 and 203 are respectively surrounded by p-type buried layers 320. That is, the first and second transistors 108 and 109 are separated by LOCOS film 315 and the channel-stopper of the p-type buried layer 320.

Further, in a space in between LOCOS films 315 separating the first and second transistor 108 and 109, the third n-type buried layer or the second conduction-type semiconductor region 211 is formed so as to surround the p-type buried layer 320 surrounding the first n-type buried layer 202. Similarly, the fourth n-type buried layer or the second-conduction-type semiconductor region 212 is formed so as to surround the p-type buried layer 320 surrounding the second buried layer 203. Two n-type layers 215 are respectively formed on the third and fourth n-type buried layers 211 and 212,, and a first electrode 106 and a second electrode 107 are formed on these n-type layers 215, respectively, in order to supply the electric potentials to the third and fourth high concentration n-type buried layer 211 and 212, respectively.

Similar to the first embodiment, a favorable feature of the second embodiment is that cross-talk through the epitaxial layers and the buried layers are sufficiently eliminated by stabilizing the electric potentials of the n-type buried layers 211 and 212, which surround the first and the second transistors 108 and 109 by the power supply through electrodes 106 and 107. Furthermore, since this embodiment uses LOCOS films for element separation, it is made possible to further reduce the number of processes in manufacturing the semiconductor device compared with that of the first embodiment, thereby the cost and time for manufacturing can be reduced.

The third embodiment of the present invention will be described hereinafter. FIG. 3 depicts the semiconductor device according to the third embodiment, which is characterized in making use of a SOI substrate.

Figure 3A:
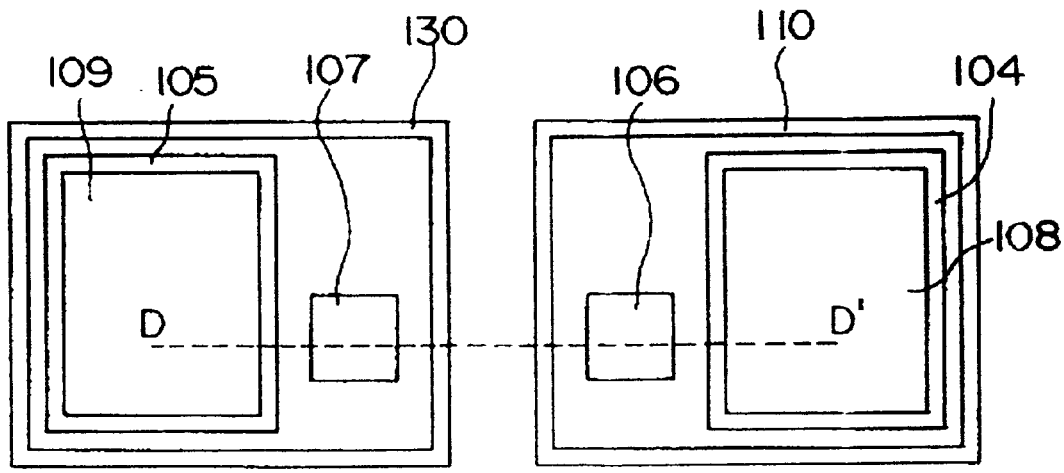
FIG. 3A is a plan view.
Figure 3B:
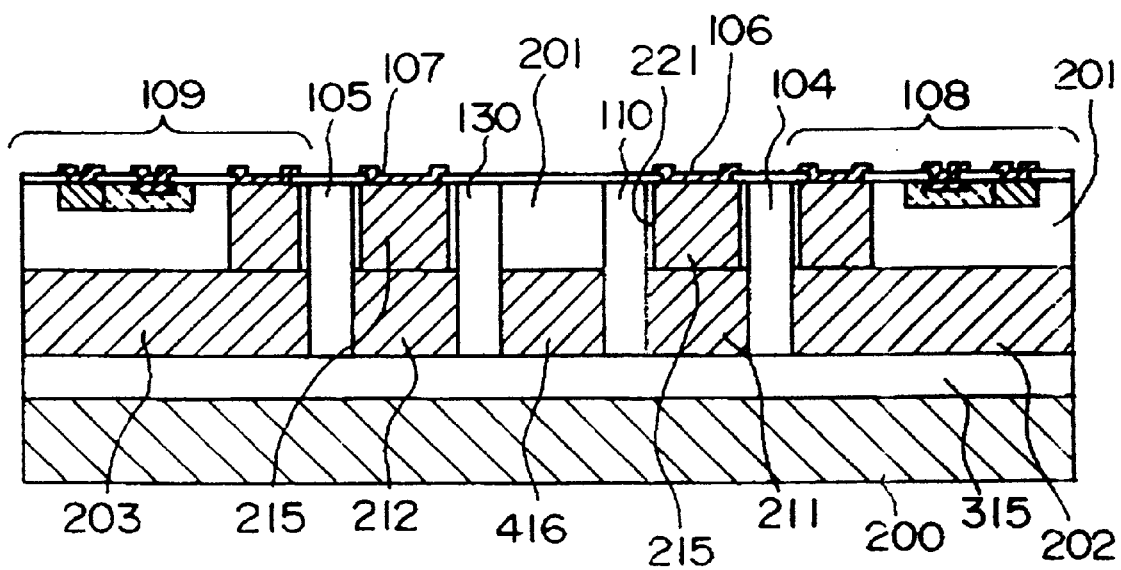
FIG. 3B is a cross sectional view along the line D-D'.

As shown in FIGS. 3A and 3B, n-type buried layers 202, 211, 416, 212, and 203 with an impurity concentration of 5×10$^{19}$ cm$^{-3}$ are formed in a thickness of 0.8 $\mu m$ covering the silicon oxide layer 315 with a thickness of approximately 500 nm formed on the p-type silicon substrate or the first-conduction-type semiconductor substrate 200. On these n-type buried layers, an n-type epitaxial layers 201 having an impurity concentration level of 10$^{16}$ cm$^{-3}$ are formed at a thickness of around 0.8 $\mu m$ and the first transistor 108 and the second transistor 109 are formed on these n-type epitaxial layers 201. The first transistor constitutes the circuit to be operated by the first power supply and the second transistor 109 constitutes the circuit operated by the second power supply.

Further, first trenches 104 and 105 are formed in a width of around 1 $\mu m$ and a depth of around 2.8 $\mu m$ so as to surround the first and second transistors 108 and 109, respectively. Inner surfaces of these first trenches 105 are covered with a thin insulating film of silicon oxide or silicon nitride, and the interiors of these trenches are filled with silicon oxide or amorphous silicon.

Second trenches 110 and 130 are formed outside of the first trenches 104 and 105, respectively. In a space between the first trenches 104 and 105 and the second trenches 110 and 130, similar n-type buried layers 215 are formed on the n-type layers 211 and 212 which are respectively located adjacent to the first transistor 108 and the second transistors 109. A first electrode 106 and a second electrode 107 are formed on respective buried layers 215 in order to supply electric potentials to corresponding n-type buried layers 211 and 212, respectively.

In general, in the case when a ordinary silicon substrate is used, the capacitance of the transistor against the substrate is determined by a capacitance of the pn junction. However, in the case when the SOI substrate is used, due to the thick oxide layer involved in the substrate, the value of the capacitance per unit area becomes smaller than that of the device using the ordinary silicon substrate. Therefore, in the present embodiment, cross talk through the substrate can be reduced by use of the SOI substrate because the capacitance of the transistor against the substrate is reduced.

Furthermore, all n-type buried layers 202, 211, 416, 212, and 203 are formed covering the surface of the LOCOS type film at the same time, so that it is possible to reduce the number of manufacturing processes. In the conventional device, the parasitic resistance of the field region located between two circuit blocks is considerably reduced by forming all buried layers on the same surface of the LOCOS film, which results in an increase in cross talk.

However, in the present embodiment, it is possible to prevent an increase in cross talk by stabilizing the potential of the field region at a fixed value. In addition, if the potential stabilization of a fifth n-type buried layer 416 is carried out by a third power supply without potential fluctuation, it becomes possible to further reduce cross talk.

The fourth embodiment will be described hereinafter referring to FIG. 4. FIG. 4 depicts a semiconductor device of the fourth embodiment, which is characterized in that two transistors of the present semiconductor device are separated by respective trenches and two transistor forming regions are surrounded by a common n-type buried layer.

Figure 4A:
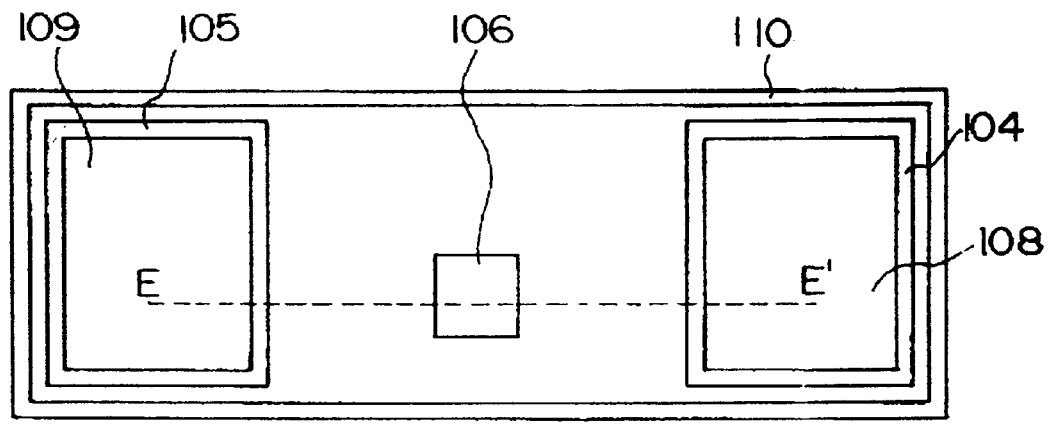
FIG. 4A is a plan view.
Figure 4B:
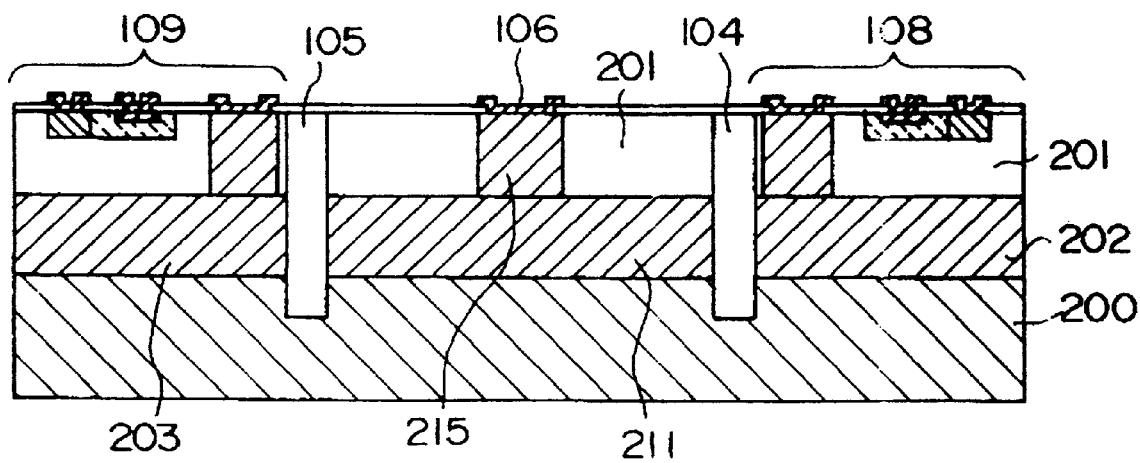
FIG. 4B is a cross sectional view along the line E-E'.
Figure 5A:
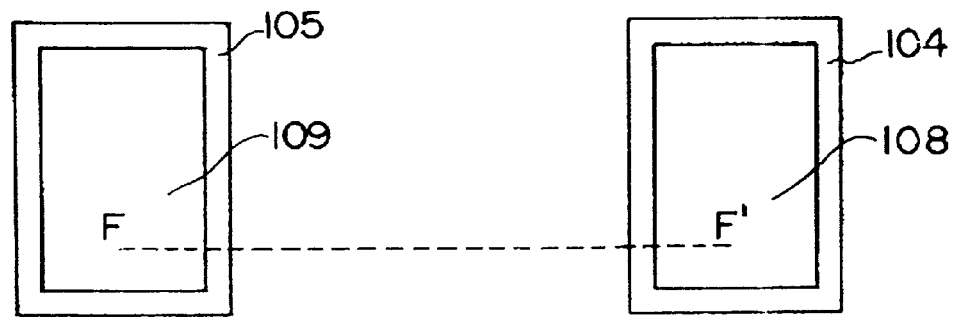
FIG. 5A is a plan view.
Figure 5B:
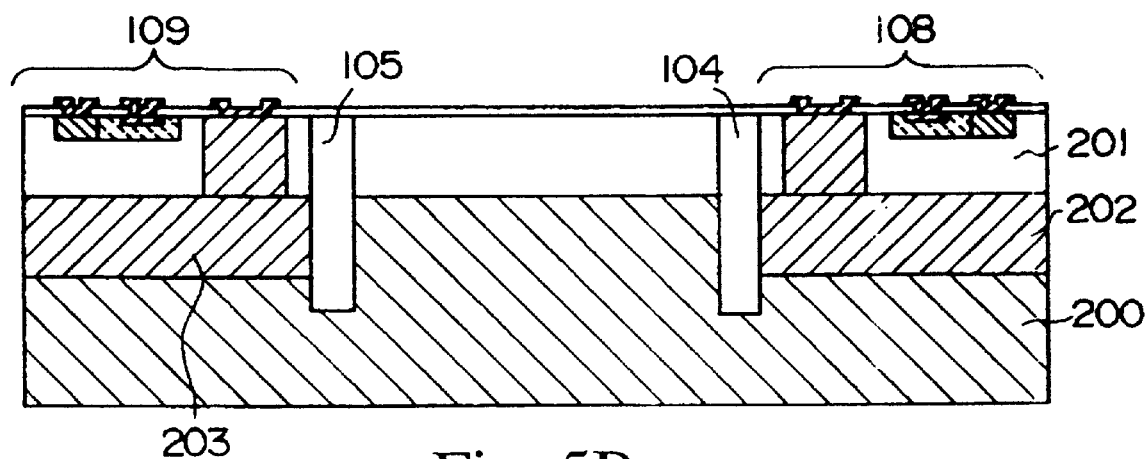
FIG. 5B is a cross sectional view along the line F-F'.
Figure 6:
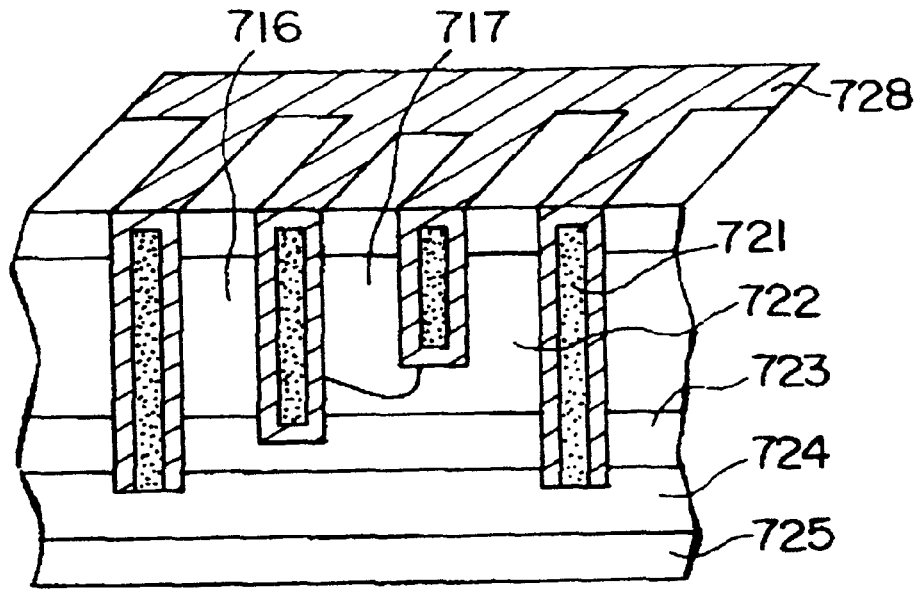
FIG. 6 illustrates a cross sectional view of a known structure of a conventional semiconductor device.
Figure 7:
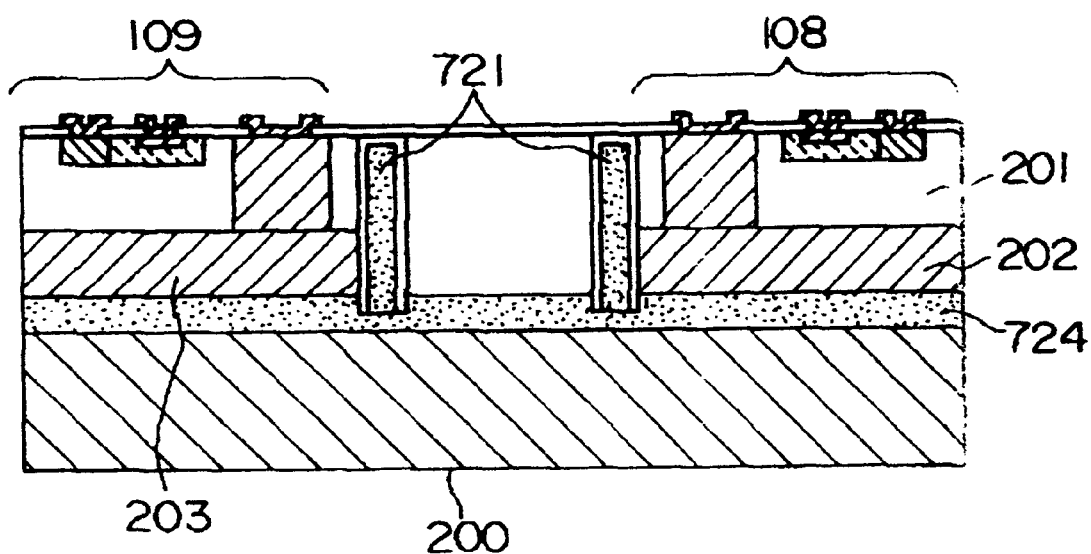
FIG. 7 illustrates a conventional semiconductor device in which the known structure shown in FIG. 6 is applied.

As shown in FIGS. 4A and 4B, first n-type high-concentration buried layer or the second-conduction-type semiconductor region 202 is formed in the region defined as the first element forming region, in which the first transistor is to be formed and which is located on the p-type silicon substrate or the first conductive semiconductor substrate 200, and a second n-type high concentration buried layer 203 is formed in the region defined as the second element forming region, in which the second transistor is to be formed and which is located on the same substrate 200.

Further, n-type epitaxial layers 201 are formed on the first and second high concentration n-type buried layer 202 and 203, respectively, and two transistors are formed, wherein the first transistor 108 constitutes a circuit to be operated by the first power supply and the second transistor 109 constitutes a circuit to be operated by the second power supply.

The first trenches 104 and 105 are formed so as to surround the first and second transistors 108 and 109, respectively. Inner walls of these trenches 104 and 105 are covered with an insulating film made of silicon oxide or silicon nitride, and the interiors of these trenches 104 and 105 are filled with silicon oxide or polysilicon or the like.

Two trenches 104 and 105 are commonly surrounded by a second trench 110. In a space between the first trenches 104 and 105 and the second trench 110, the third high concentration n-type buried layer or the second-conduction-type semiconductor region 211 is formed so as to commonly surround the first and second high concentration n-type buried layers. On the top of the third high concentration n-type buried layer 211, a high concentration n-type buried layer 215 is formed, on which an electrode 106 is formed in order to supply the electric potential to the third high concentration n-type buried layer 211.

The semiconductor device of the present embodiment may be rather worse than that of the other embodiments described above in reducing cross talk. However, the structure of the present semiconductor device enables downsizing of the semiconductor device, because, it only requires the formation of one electrode on the third high concentration buried layer 211, which commonly surrounds the first and second transistors 108 and 109, while, it may be more difficult for the other structures to lead to reduction in the size of the device, because two electrodes are formed on separated n-type buried layers surrounding transistors.

It is to be understood that this invention is not limited to the forms described in the above embodiments and changes may be made without departing from the scope of the invention. For example, the above embodiments have a form in which individual transistors are surrounded by respective n-type buried layers, while, if desired, a form may be adopted in which a single n-type buried layer surrounds a portion of or all of the circuit blocks. In turn, cross talk can be reduced effectively when the circumferential length of the buried layer is reduced and thereby the parasitic resistance and the parasitic capacitance are reduced. Thus, it is preferable to surround only the most effective area among regions of either one or both circuits which process large signals or small signals. In addition, numerical values in terms of the impurity concentration and the thickness of each layers and the depth and the width of trenches may be changed appropriately.

As described above, in the present invention, reduction or elimination of cross talk in semiconductor devices, especially in the semiconductor devices provided with multiple power supplies is made possible. The reason is due to the form in which the element forming regions are surrounded by semiconductor regions and the potential of the semiconductor region is stabilized by the supply of power through an electrode formed on the surface of the semiconductor region. It should be noted that the structure elaborated in the semiconductor device of the present invention neither accompany an increase in parasitic resistance or parasitic capacitance, nor a deterioration in high frequency characteristics.

While the forms of semiconductor devices herein described constitute preferred embodiments of this invention, it is to be understood that this invention is not limited to these forms, and changes may be made in either without departing from the scope of the invention, which is defined in the appended claims.

What is claimed is:

1. A semiconductor device comprising:
    a first element forming region and a second element forming region formed on a substrate of a first conduction type;
    a first semiconductor region and a second semiconductor region of a second conduction type, the second conduction type being an opposite conduction type of the first conduction type, said first semiconductor region and said second semiconductor region being formed so as to surround said first and said second element forming regions respectively;
    a first trench located intermediate said first element forming region and said first semiconductor region, said first trench surrounding said first element forming region and forming a closed perimeter around said first element forming region;
    a second trench located intermediate said second element forming region and said second semiconductor region, said second trench surrounding said second element forming region and forming a closed perimeter around said second element forming region;

a third trench and a fourth trench surrounding and forming a closed perimeter around said first and second semiconductor regions respectively; and a first separating region separating said first semiconductor region and said second semiconductor region, wherein a first electric potential of said first semiconductor region is stabilized at a value of a first power supply through a first electrode formed on said first semiconductor region and a second electric potential of said second semiconductor region is stabilized at a value of a second power supply through a second electrode formed on said second semiconductor region.

2. The semiconductor device of claim 1 wherein said first semiconductor region, said second semiconductor region, and said first and said second element forming regions are of the same impurity concentration, and said first semiconductor region and said second semiconductor region extend from a lower surface of said first and second element forming regions to an upper surface of said first and second trenches.

3. The semiconductor device of claim 1 wherein said first and second trenches extend below a lower surface of said first and second element forming regions and into said substrate.

4. The semiconductor device of claim 2 wherein said first semiconductor region and said second semiconductor region each comprise two buried regions of the same impurity concentration.

5. The semiconductor device of claim 1 wherein said first separating region comprises a lower substrate region extending upwardly from a lower surface of said third and fourth trenches and a epitaxial layer region extending from an upper surface of said lower substrate region to an upper surface of said third and fourth trenches.

6. The semiconductor device of claim 1 wherein said first separating region comprises a lower semiconductor region extending upwardly from a lower surface of said third and fourth trenches and a epitaxial layer region extending from an upper surface of said lower substrate region to an upper surface of said third and fourth trenches, said lower semiconductor region being of the second conduction type and the same impurity concentration as said first and second element forming regions.

7. The semiconductor device of claim 1 wherein said first semiconductor regions and said second semiconductor region are buried layers.

8. The semiconductor device of claim 1 wherein said substrate is a SOI substrate.

9. A semiconductor device comprising:

a substrate of a first conduction type;

a first element forming region and a second element forming region formed on a substrate, said first and second element forming regions being of a second conduction type;

a first semiconductor region and a second semiconductor region of the second conduction type, said first semiconductor region and said second semiconductor region being formed so as to surround said first and said second element forming regions respectively;

a first separation perimeter located intermediate said first element forming region and said first semiconductor region, said first separation perimeter surrounding said first element forming region and forming a closed perimeter around said first element forming region;

a second separation perimeter located intermediate said second element forming region and said second semiconductor region, said second separation perimeter surrounding said second element forming region and forming a closed perimeter around said second element forming region;

said first and said second separation perimeters each comprising a lower buried region of the first conductivity type and an upper locus film region; and a first separating region separating said first semiconductor region and said second semiconductor region, wherein a first electric potential of said first semiconductor region is stabilized at a value of a first power supply through a first electrode formed on said first semiconductor region and a second electric potential of said second semiconductor region is stabilized at a value of a second power supply through a second electrode formed on said second semiconductor region.

10. The semiconductor device of claim 9 wherein said first semiconductor region, said second semiconductor region, and said first and said second element forming regions are of the same impurity concentration, and said first semiconductor region and said second semiconductor region extend from a lower surface of said first and second element forming regions to an upper surface of said first and second separation perimeters.

11. The semiconductor device of claim 9 wherein said first separating region separating said first semiconductor region and said second semiconductor region comprises a lower buried region of the first conductivity type and an upper locus film region.

12. The semiconductor device of claim 9 wherein said first semiconductor region and said second semiconductor region each comprise two buried regions of the same impurity concentration.

13. The semiconductor device of claim 9 wherein said first semiconductor regions and said second semiconductor region are buried layers.

* * * * *